United States Patent [19]

Schieve et al.

[11] Patent Number: 5,423,028

[45] Date of Patent: Jun. 6, 1995

[54] DIAGNOSTIC PROCEDURE FOR IDENTIFYING PRESENCE OF COMPUTER MEMORY

[75] Inventors: Eric W. Schieve; Richard W. Finch, both of Austin, Tex.

[73] Assignee: Dell USA, L.P., Austin, Tex.

[21] Appl. No.: 32,956

[22] Filed: Mar. 17, 1993

[51] Int. Cl.⁶ .............................................. G06F 11/00
[52] U.S. Cl. ..................................... 395/575; 371/212
[58] Field of Search ........................... 364/244, 965.78; 395/575, 425, 700; 371/21.1, 21.2, 21.3, 21.6

[56] References Cited

U.S. PATENT DOCUMENTS 5,299,202  3/1994  Vaillancourt ................. 371/21.1

Primary Examiner—Vincent P. Canney
Attorney, Agent, or Firm—David Hitt; James Huffman

[57] ABSTRACT

Disclosed is a diagnostic procedure for identifying and sizing computer memory, which, in the preferred embodiment of the invention, comprises SIMMs. The procedure comprises the steps of (1) testing a plurality of memory locations in the unit by writing and reading bit patterns to memory locations in succession to determine whether any of the memory locations contains any responding bits and (2) stipulating the unit to be present when a number of the memory locations having any responding bits reaches a predetermined minimum number. The procedure is uniquely designed to detect memory which is not fully functional.

44 Claims, 3 Drawing Sheets

DIAGNOSTIC PROCEDURE FOR IDENTIFYING PRESENCE OF COMPUTER MEMORY

TECHNICAL FIELD OF THE INVENTION

The present invention is directed in general to diagnostics for computer memories and, more specifically, to a procedure for identifying and characterizing memory size for diagnostic purposes, even if that memory is not fully functional.

BACKGROUND OF THE INVENTION

The identification and sizing of memory in a computer system is a prerequisite for performing diagnostic memory tests. The tests require knowledge of the type of memory present in the system and how many of that type of memory are installed. Main memory in current IBM-compatible personal computers ("PCs") is typically physically organized in replaceable components referred to as single in-line memory modules ("SIMMs"). SIMMs are replaceable snap-in, snap-out components so designed to allow relatively unsophisticated computer users to replace or increase computer memory. SIMMs offer versatility in configuration of computer memory, available in individual sizes from one megabyte to 16 megabytes per SIMM, a computer memory having multiple SIMMS in the system.

Traditionally, PCs have employed a basic input/output system power on-self test ("BIOS POST") to perform sizing of computer memory. BIOS POST is an initialization procedure stored in BIOS firmware and executed when a system is booted; part of this BIOS POST procedure is to size the memory that is in the system, typically storing the result in CMOS RAM (complementary metal oxide semiconductor random access memory that is constantly powered to allow it to function even when the computer is turned off) to inform the system of the amount of memory available. A memory controller in the PC requires knowledge of the amount of memory within the computer to allow it to fully address the memory.

The intent of the above-described BIOS POST memory sizing procedure is to determine the amount of fully-functioning memory within the computer. PCs are not currently designed to deal with memory that is less than fully functional. Thus, BIOS POST tests the full functionality of memory and, if it finds a defect in any portion of a unit of memory (a particular SIMM or SIMM bank), it will simply disregard the entire unit of memory, and the computer will function without accessing the unit at all. BIOS POST is thus an initialization procedure rather than a diagnostic, and therefore interested in only tabulating fully-functioning memory in the system. Detecting defective memory is quite simple: accesses are performed on memory locations, and if they do not respond absolutely perfectly then that location is discounted, and, as described previously, the entire SIMM is marked as defective and not programmed into the memory controller's tables.

The BIOS POST boot up sequence will not even flag a very defective memory component. Instead, the sum total of memory that is displayed on the screen is merely reduced from what is expected. The result is a fairly subtle indicator to a customer that they do not have in memory what they should. Thus, what is needed in the art is a process for detecting a defective memory, flagging it in a very obvious fashion and then informing a user that there is defective memory to be replaced.

In stark contrast to a BIOS POST memory initialization procedure, a diagnostic memory sizing procedure should identify all memory that is plugged into the system, regardless of how functional it may be. If, as in the case of BIOS POST, defective memory is simply discounted from the sum total, then the subsequent diagnostic memory test does not test it, and it is not obvious to the user that there actually exists defective memory. Therefore, a diagnostic memory sizing procedure must be very liberal about including as much memory as is possible and determining nonexistent memory from defective memory. To a computer, defective memory can sometimes appear similar to missing memory. A diagnostic sizing procedure should discern memory presence from memory absence so that a subsequent memory diagnostic test can subsequently examine it to determine whether it is indeed defective, and, if defective, identify it to the user, allowing the user to take remedial action.

The prior art is entirely deficient in providing a procedure for determining the amount of memory present in a computer system, no matter how functional that memory is. In other words, there has not yet existed a method of determining the difference between defective memory and nonexistent memory.

SUMMARY OF THE INVENTION

Accordingly, it is a primary object of the present invention to provide a way of detecting the presence of computer memory, even if that memory is defective. To address the primary object, the present invention tests a plurality of memory locations in a unit of memory by writing and reading bit patterns to each of the memory locations in succession to determine whether each of the memory locations contains any responding bits. For purposes of the present invention, a responding bit is a bit location that accurately stores a previously written bit (a "one" remains a "one" and a "zero" remains a "zero"). Also, for purposes of the present invention, the term "bit fidelity" refers to a responding bit. In other words, what is read has fidelity with respect to what was written.

The present invention stipulates the memory unit to be present when a total number of the memory locations reaches a predetermined minimum number. Thus, the present invention, on a chip-by-chip (or rather SIMM-by-SIMM) basis attempts to very liberally identify any memory that responds. The process looks for a certain minimum number of locations that respond with at least one single bit after a large number of access cycles have been performed on that word. This certain number is an arbitrary minimum number of responding locations chosen by the user that, in the preferred embodiment of the present invention, is 10.

More specifically, the chip identification procedure is initially programmed to look for the maximum chip size possible within the SIMM. The procedure starts with a counter initialized to 0. A walking 1's and 0's test is performed on the first location within the memory chip (the walking 1's and O's test is described in the Detailed Description of the Invention section). These tests are performed along the diagonal of the chip matrix. As each 1 and 0 is written to each bit position within the memory location, the procedure then reads back from each bit position and tracks correctly responding bits within a field mask. At the end of this write-read cycle, the field mask will comprise 1 bits that indicate responding bit positions and 0 bits that represent non-responding positions. Next, the procedure makes an inquiry whether the field mask has any responding bits. If no, the procedure is then performed on the next memory location along the diagonal of the chip matrix, if there are memory locations still to be tested.

If the field mask does contain at least one responding bit, the counter is incremented by one and is then tested against a predetermined minimum number. If the counter reaches this predetermined minimum number by the time the last location in the diagonal is tested, the SIMM is deemed to be present. The counter tracks the number of tested memory locations that have at least one responding bit position. If the counter has not reached the predetermined minimum number by the time the last location in the diagonal is tested, the entire procedure is then performed on the next memory location. If all the memory locations within the chip of maximum possible size have been tested and the requisite number of locations having responding bits is not reached, the procedure determines that no memory is present.

When the previously described procedure determines that a memory chip is present, a second procedure is performed to determine the size of the memory chip. This procedure begins with a table of trial chip sizes, specifically the row length of these chip sizes. Sizing procedure begins with an initial trial chip row size and writes a 0 to the location last visited by the previously described identification procedure. The sizing procedure then determines whether this location lies within the first half or the second half within its particular row. An offset is then applied to move the location within the same row to a location that is offset by the number of locations within the trial chip row size. An FF pattern is then written to that location. Procedure next reads the original location to determine whether its bits have changed due to the writing of the FF bit pattern. This determination is done in conjunction with the original field mask produced at that location within the previously described identification procedure. This allows the chip sizing procedure to operate even if the memory location at which it is performing its testing is partially defective. If a procedure determines that the bits read from the original location have changed, then this determines that a column address strobe wrap has occurred and that the chip size is equal to a trial chip size chosen at the beginning of the sizing procedure. If the original location has not been changed, then the chip size has not been determined and the procedure repeats for the next trial chip size.

Although the chip-sizing procedure described immediately above is not within the subject matter of the present invention, the field mask that the identification procedure of the present invention develops for each SIMM during its operation is retained for use by the sizing procedure. Standard sizing procedures are not designed to size defective memory. However, through use of the field mask, memory defects in a particular SIMM are rendered invisible to the chip-sizing procedure, allowing it to size even defective memory. This is an important aspect of the present invention.

The foregoing has outlined rather broadly the features and technical advantages of the present invention so that the detailed description of the invention that follows may be better understood. Additional features and advantages of the invention will be described hereinafter and also constitute the subject of the claims of the present invention. Those skilled in the art should appreciate that the conception and the specific embodiment disclosed may be readily used as a basis for modifying or designing other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
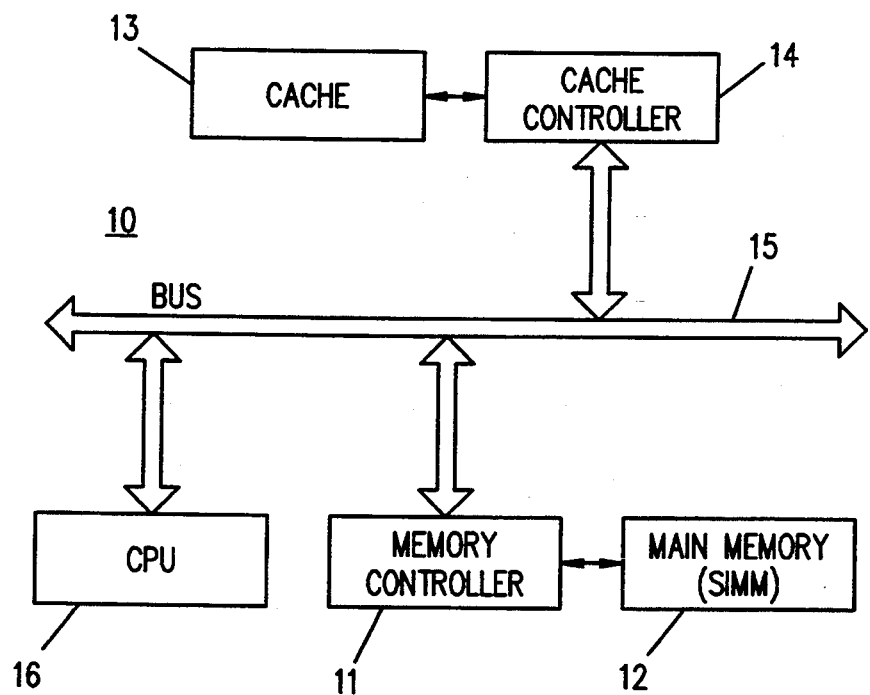
FIG. 1 illustrates a system in which the present invention may be embodied.

Referring to FIG. 1, there is illustrated a simplified partial diagram of the architecture of typical computing system 10 in which the present invention may be embodied. As these systems are well known in the art, only the portions of system 10 pertinent to the present invention will be discussed.

System 10 includes system bus 15 which interconnects CPU 16 to memory controller 11, main memory 12 comprised of SIMMs, cache controller 14 and cache memory 13. As required, CPU 16 will access particular SIMMs within main memory 12 through memory controller 11, and cache 13 through cache controller 14.

Figure 2:
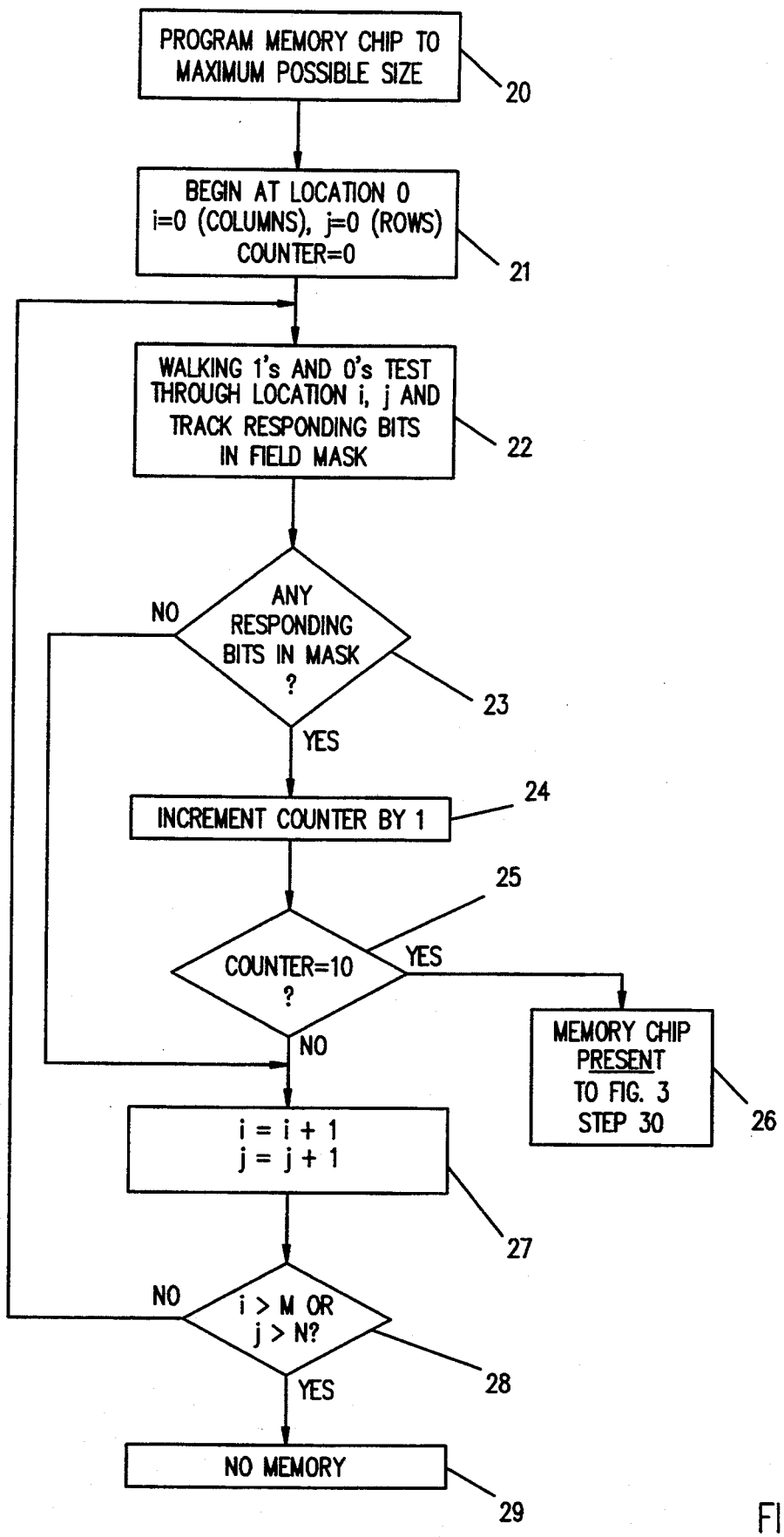
FIG. 2 illustrates a flow chart for a process for identifying present memory.

Referring to FIG. 2, there is illustrated the identification process for identifying the presence or absence of memory of the present invention. In step 20, a particular SIMM or chip within main memory 12 is chosen and programmed by memory controller 11 to the maximum possible size that system 10 can handle. That is, the possible trial sizes of chips is something that is well known in advance. There is a certain finite number of different types of SIMMs that memory controller 11 can handle, which is part of the hardware design. These configurations are well known in the art. The programming of a particular SIMM for the maximum possible size is performed in terms of rows and columns of the chip matrix.

The process to be described will be performed on chip locations along the diagonal of the chip matrix. Initially, in step 21, the process is set for diagonal location i=0, j=0 (location 0) and a counter, to be subsequently described in detail, is set to 0.

Chip matrices are not necessarily square, but may be rectangular. In the past, chip matrices have typically been square matrices where the number of rows is equal to the number of columns. The present invention may be performed on square or rectangular chip matrices.

Each element in the chip diagonal represents a word (a single location word, or addressable location in memory). At step 22, at each location, the process performs what is called a walking 1's and 0's test on that address location. For an 8-bit or byte wide location, a walking 1's test writes a binary 1 to the memory location, reads it back, then writes a binary 2 to the location, reads it back, and writes a binary 4, etc. until a 1 has been "walked" through every bit within the byte-wide memory location. Essentially, a 1 bit is walked through a field of 0's. The walking 0's part of this process is to then walk a single 0 bit through a field of 1's. In other words, the test writes and reads an FE, then writes and reads an FD, etc. until a 0 has been "walked" through every bit within the byte-wide memory location.

As the walking 1's and 0's test is performed, on each read cycle the number of bits that respond correctly in the word are tracked. More particularly, correctly responding bits are signified by a 1 bit within a field mask, and nonresponding bits are signified by a 0. Bit masking techniques are well known in the art and are not discussed here in detail. At the end of each cycle, the responding bits are then ANDed (logically) into the mask, so that at the end of the complete cycle of walking 1's and 0's, there is a bit mask consisting of 1 bits representing the bit positions that responded correctly through all cycles of the walking 1's and 0's test. In other words, a 1 set in the bit mask indicates a bit position that responded correctly every single time during the write-read cycle. If a bit responds incorrectly even once, then it is indicated as a 0 in the mask. Therefore, mask bits are bits that respond correctly through all cycles.

Next, at step 23, the process determines if at the end of this cycle of walking 1's and 0's, there is any one bit set within the mask. If yes, then at step 24, the previously mentioned counter is incremented by one. Thus, that memory location is considered to be responding, since at least one bit within the memory location responded correctly. If at step 23, there are no bits set in the mask, then the process proceeds to step 27 to increment column i and row j by one.

Thereafter, at step 25, the counter is compared with a predetermined value, e.g., ten. If the counter value is less than this predetermined minimum, the process proceeds to step 27 where the process is started over at the next diagonal element in the chip matrix, i.e., i and j are incremented by one. If the counter value is equal to the predetermined value, this indicates that the predetermined number (ten, in this example) of memory locations have been discovered that respond correctly with at least a single nondefective bit. This indication provides a determination that memory is in fact present in this particular SIMM socket or this particular chip location. Therefore, at step 26, the process transfers out of this part of the flow chart to the memory sizing part of the present invention, which is shown in FIG. 3.

At step 28, column i and row j are checked whether either is greater than the column or row numbers originally chosen in the maximum chip size. If yes, then this provides an indication that all the diagonal elements in the chip have been tested (since the maximum possible chip size has been tested) and the process has been unable to find ten responding locations, which designates this tested location as containing no memory (step 29). If both i and j are less than the maximum chip column and row sizes, then the walking 1's and 0's process is repeated at step 22. The process is repeated until the predetermined minimum count level is reached or all the diagonal elements in the chip have been tested.

Figure 3:
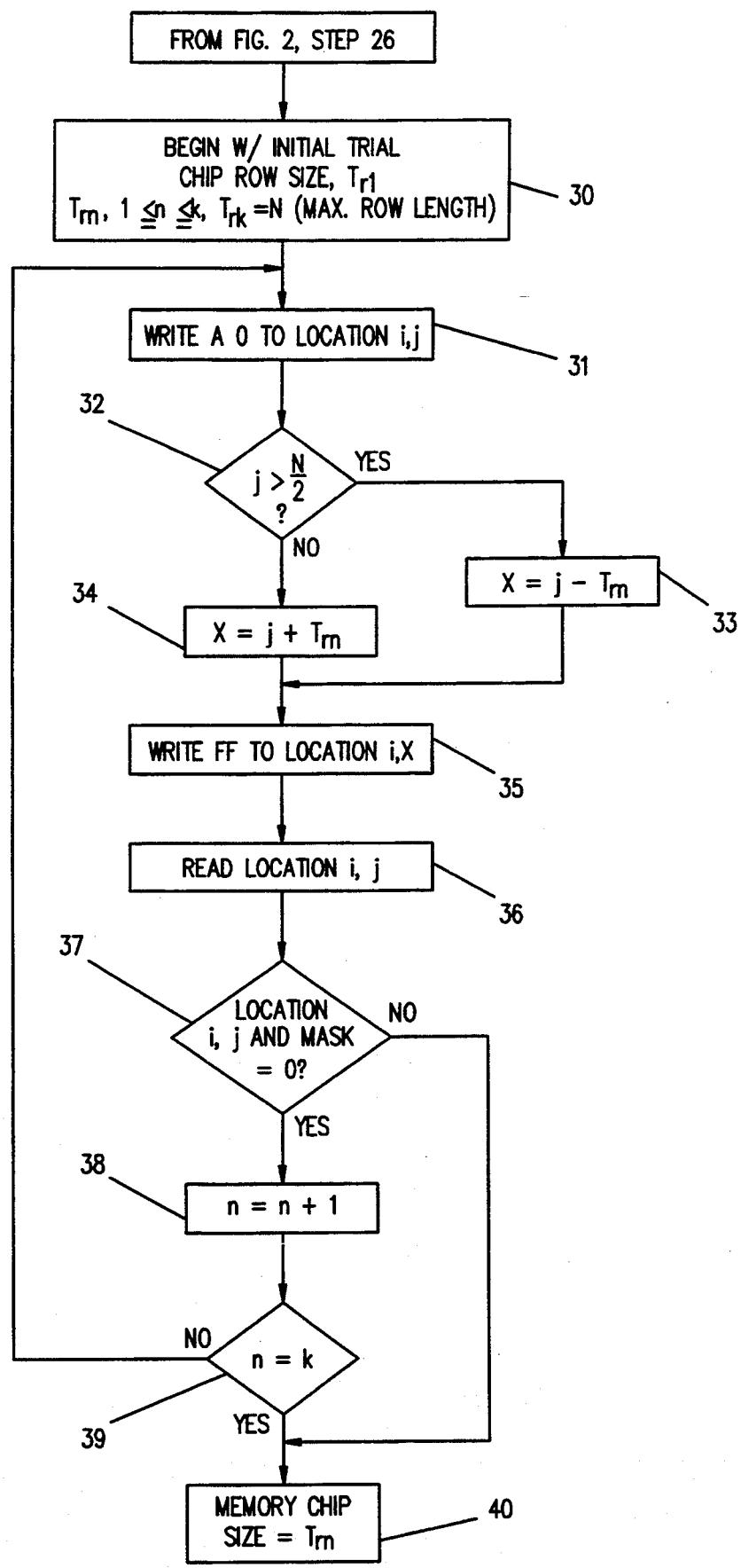
FIG. 3 illustrates a flow chart for a process for sizing a memory chip that has been previously determined as present.

Referring next to FIG. 3, there is illustrated a flow chart diagramming the subsequent memory sizing process, which may be referred to as a CAS (column address strobe) wrap procedure. The process begins at step 30, which is the next step subsequent to step 26 in the memory identification process previously described with reference to FIG. 2. Step 30 begins with the memory location that was previously tabulated for the last responding memory location identified as present in step 26 and its associated bit mask.

The chip sizing process of FIG. 3 performs a trial procedure for the possible different chip sizes that the system could support, and these are tabulated in terms of the row width of the possible chip sizes. The process is not particularly interested in the column length of the chips, therefore, the chips are tabulated in terms of row length in ascending order. In other words, in step 30, the first value in the trial chip size table is the smallest possible row length. Thus, the process, in step 31, chooses the smallest row length and writes a zero to the current location, i.e. location i, j, which is the last responding location detected from the identification procedure in FIG. 2.

Since the chip is still programmed for its maximum possible size, the process at step 32 tests if the row length is greater than half the maximum possible row length. This tests the row location to determine if it is in the first half or the second half of the row. If the row location is in the second half of the row, then, in step 33, a delta offset is chosen to move away from this location in the negative direction so as to remain within the current row. If the row location is determined in step 32 to be in the first half of the row, then, in step 34, a delta is chosen to move away from this location in the positive direction so as to remain within the current row of the chip. This delta offset equals the trial row size, which in this first pass through the process is the smallest possible chip size.

Once this offset location within the row is acquired, at step 35, the process writes an FF bit pattern (all 1's within the word byte) to the offset location. Next, at step 36, the process returns to the original location i,j, and reads the current value at the location. At step 37, a logical bit-wise AND is performed with the mask, which is still the bit mask that was determined from the previous identification process in FIG. 2. In other words, by writing FF to the delta location, the logical AND calculation can determine if any of the known valid bits changed at the current location i,j. If any of the bits at the current location i,j changed then a CAS wrap has occurred and the chip size has been identified (step 40); the chip size being the row length from the current element of the table. If the result of the logical calculation is zero, then none of the bits at the current location i,j were affected by writing to the delta location and the process has not determined the chip size. Thus, the process proceeds to step 38 to increment to the next trial chip (row) size and thereafter proceeds to step 39 to inquire whether the last trial chip size has been attempted by the sizing process. If yes, then the process has determined that the chip size must be the largest trial size in the table (step 40). If no, then the process returns to step 31 to repeat the process for the next trial size.

The sizing process is a conventional sizing process except for the use of the mask in examining the behavior of the trial location. The mask allows the process to only test at bits that are known to be good from the previous identification process. Writing to the delta location depending on actual chip size can cause what is known as an alias. In other words, the sizing process can cause the process to actually access the trial location, therefore a zero has been written to the trial location and a complement, an FF, has been written to the delta location hoping that in fact the delta location is the same as the trial location and is thus overwriting it. However, in more conventional procedures, a response from the entire word is looked for, i.e. if the entire word has changed to an FF. The sizing process of the present invention observes only the bits in that word that are known to be responsive and not defective from the previous identification process. As a result, a conventional memory sizing routine has been improved to allow it to size memory that may not be fully functional.

Although the present invention and its advantages have been described in detail, those skilled in the art should understand that various changes, substitutions and alterations can be made herein without departing from the spirit and scope of the invention as defined by the appended claims.

What is claimed is:

1. A method of determining presence of a unit of memory in a computer system, comprising the steps of:
   testing a plurality of memory locations in said unit by writing and reading bit patterns to said memory locations in succession to determine whether said memory locations contains any responding bits; and
   stipulating said unit to be present when a number of said memory locations containing any responding bits reaches a predetermined minimum number.

2. The method as recited in claim 1 further comprising the step of initializing a nondefective memory location counter to a zero value.

3. The method as recited in claim 1 wherein said testing step comprises the step of filling a specified one of said plurality of memory locations in said unit with logical zeros.

4. The method as recited in claim 1 wherein said testing step comprises the step of walking a logical one through successive bit positions in a specified one of said plurality of memory locations in said unit.

5. The method as recited in claim 1 wherein said testing step comprises the step of recording in a bit mask which of successive bit positions in a specified one of said plurality of memory locations in said unit is a nondefective bit.

6. The method as recited in claim 1 wherein said testing step comprises the step of filling a specified one of said plurality of memory locations in said unit with logical ones.

7. The method as recited in claim 1 wherein said testing step comprises the step of walking a logical zero through successive bit positions in a specified one of said plurality of memory locations in said unit.

8. The method as recited in claim 1 further comprising the step of incrementing a nondefective memory location counter when a mask records a presence of a nondefective bit in a specified one of said plurality of memory locations in said unit.

9. The method as recited in claim 1 wherein a nondefective memory location counter reaches a preselected minimum number, therefore indicating said unit to be present.

10. The method as recited in claim 1 further comprising the step of stipulating said unit to be absent when a nondefective memory location counter has failed to reach a preselected minimum number and all of said plurality of memory locations have been tested.

11. The method as recited in claim 1 wherein said plurality of memory locations lie along a matrix diagonal of said unit.

12. The method as recited in claim 2 wherein said plurality of memory locations lie along a matrix diagonal of a SIMM of a maximum size.

13. The method as recited in claim 1 wherein a mask represents responding bits as a logical one and nonresponding bits as a logical zero.

14. A circuit for determining presence of a unit of memory in a computer system, comprising:
   a microprocessor coupled to said unit, said microprocessor performing a series of write-read operations on a sequence of multi-bit memory locations within said unit to determine bit fidelity of said memory locations in said sequence; and
   a counter coupled to said microprocessor, said counter recording occurrences of said memory locations having at least single bit fidelity, said counter permitting said microprocessor to discern presence or absence of said unit as a function of fidelity of a single bit in a preselected minimum number of said sequence, said circuit capable of discerning said unit presence when said unit is only partially functional.

15. The circuit as recited in claim 14, further comprising means for initializing a nondefective memory location counter to a zero value.

16. The circuit as recited in claim 14 wherein said microprocessor comprises means for filling a specified one of said memory locations in said unit with logical zeros.

17. The circuit as recited in claim 14 wherein said microprocessor comprises means for walking a logical one through successive bit positions in a specified one of said memory locations in said unit.

18. The circuit as recited in claim 14 wherein said microprocessor comprises means for recording in a bit mask which of successive bit positions in a specified one of said memory locations in said unit is a nondefective bit.

19. The circuit as recited in claim 14 wherein said microprocessor comprises means for filling a specified one of said memory locations in said unit with logical ones.

20. The circuit as recited in claim 14 wherein said microprocessor comprises means for walking a logical zero through successive bit positions in a specified one of said memory locations in said unit.

21. The circuit as recited in claim 14, further comprising means for incrementing a nondefective memory location counter when a mask records a presence of a nondefective bit in a specified one of said memory locations in said unit.

22. The circuit as recited in claim 14 wherein a nondefective memory location counter reaches a preselected minimum number, therefore indicating said unit to be present.

23. The circuit as recited in claim 14 further comprising means for stipulating said unit to be absent when a nondefective memory location counter has failed to reach a preselected minimum number and all of said memory locations have been tested.

24. The circuit as recited in claim 14 wherein said memory locations lie along a matrix diagonal of said unit.

25. The circuit as recited in claim 15 wherein said memory locations lie along a matrix diagonal of a SIMM of a maximum size.

26. The circuit as recited in claim 14 wherein a mask represents responding bits as a logical one and nonresponding bits as a logical zero.

27. A method of determining a quantity of SIMM banks present in a computer system, comprising the steps of:
writing and reading a specified bit pattern on a sequence of specified multi-bit memory locations within a selected one of said SIMM banks to determine which of said memory locations contain any responding bits;
counting said memory locations containing any responding bits; and
stipulating said selected one of said SIMM banks to be present when said counting of said memory locations containing any responding bits reaches a predetermined minimum number.

28. The method as recited in claim 27 further comprising the step of initializing a nondefective memory location counter to a zero value.

29. The method as recited in claim 27 wherein said writing and reading step further comprises the step of filling a specified one of said sequence of multi-bit memory locations in said SIMM bank with logical zeros.

30. The method as recited in claim 27 wherein said writing and reading step further comprises the step of walking a logical one through successive bit positions in a specified one of said sequence of multi-bit memory locations in said SIMM bank.

31. The method as recited in claim 27 wherein said writing and reading step further comprises the step of recording in a bit mask which of successive bit positions in a specified one of said sequence of multi-bit memory locations in said SIMM bank is a nondefective bit.

32. The method as recited in claim 27 wherein said writing and reading step further comprises the step of filling a specified one of said sequence of multi-bit locations in said SIMM bank with logical ones.

33. The method as recited in claim 27 wherein said writing and reading step further comprises the step of walking a logical zero through successive bit positions in a specified one of said sequence of multi-bit memory locations in said SIMM bank.

34. The method as recited in claim 27, further comprising the step of incrementing a nondefective memory location counter when a mask records a presence of a nondefective bit in a specified one of said sequence of multi-bit memory locations in said SIMM bank.

35. The method as recited in claim 27 wherein a nondefective memory location counter reaches a preselected minimum number, therefore indicating said SIMM bank to be present.

36. The method as recited in claim 27 further comprising the step of stipulating said SIMM bank to be absent when a nondefective memory location counter has failed to reach a preselected minimum number and all of said sequence of multi-bit memory locations have been tested.

37. The method as recited in claim 27 wherein said sequence of multi-bit memory locations lies along a matrix diagonal of said SIMM bank.

38. The method as recited in claim 28 wherein said sequence of multi-bit memory locations lies along a matrix diagonal of a SIMM of a maximum size.

39. The method as recited in claim 27 wherein a mask represents responding bits as a logical one and nonresponding bits as a logical zero.

40. A method of determining a quantity of SIMM banks present in a computer system, comprising the steps of:
writing a field of single value bits to a specified multi-bit memory location in a selected SIMM bank;
writing a complementary bit to successive bit positions in said memory location;
recording which of said bit positions are responding bit positions in a field mask;
counting said memory locations containing any responding bits; and
stipulating said SIMM bank to be present when said memory locations containing any responding bits reaches a predetermined minimum number.

41. The method as recited in claim 40 wherein said memory locations lie along a matrix diagonal of said SIMM bank.

42. The method as recited in claim 40, further comprising the step of stipulating said SIMM bank to be absent when a nondefective memory location counter has failed to reach a preselected minimum number and a predetermined number of said multi-bit memory locations have been tested.

43. A method of determining a quantity of SIMM banks present in a computer system, comprising the steps of:
(a) initializing a nondefective memory location counter to a zero value;
(b) filling a specified one of a sequence of multi-bit memory locations in a selected SIMM bank with logical zeros, said sequence lying along a matrix diagonal of said selected SIMM bank;
(c) walking a logical one through successive bit positions in said specified one of said sequence of multi-bit memory locations;
(d) recording in a bit mask which of said successive bit positions is a nondefective bit;
(e) filling said specified one of said sequence of multi-bit memory locations in said selected SIMM bank with logical ones;
(f) walking a logical zero through said successive bit positions in said specified one of said sequence of multi-bit memory locations;
(g) recording in said bit mask which of said successive bit positions is a nondefective bit position, said bit mask resulting in a record of which of said successive bit positions was a nondefective bit when both said logical one and said logical zero was walked through said bit positions;
(h) incrementing said nondefective memory location counter when said bit mask records a presence of said nondefective bit position in said specified one of said sequence of multi-bit memory locations;
(i) repeating steps (a) through (h) with respect to successive ones of said sequence of multi-bit memory locations until said nondefective memory location counter reaches a preselected minimum number, therefore indicating said selected SIMM bank to be present; and
(j) stipulating said selected SIMM bank to be absent when said nondefective memory location counter has failed to reach said preselected minimum number and all of said sequence of multi-bit memory locations have been tested, said method capable of discerning presence of said SIMM bank when said SIMM bank is only partially functional.

44. The method as recited in claim 43 wherein said bit mask is retained as an input to a subsequently-performed memory sizing procedure.

* * * * *